United States Patent
Wilfer

(10) Patent No.: US 6,834,921 B1
(45) Date of Patent: Dec. 28, 2004

(54) PORTABLE HOUSING CONSTRUCTED FOR ACCOMODATING AN AUDIO OR LIGHT MIXER

(76) Inventor: Hans-Peter Wilfer, Zum Hackerhof 5, D-08258 Markneukirchen (DE)

( * ) Notice: Subject to any disclaimer, the term of this patent is extended or adjusted under 35 U.S.C. 154(b) by 354 days.

(21) Appl. No.: 09/715,547
(22) Filed: Nov. 17, 2000

(30) Foreign Application Priority Data

Jul. 4, 2000 (EP) .............................................. 00114278

(51) Int. Cl.[7] .............................................. A47B 81/00
(52) U.S. Cl. ....................................... 312/290; 312/283
(58) Field of Search ................................ 312/283, 285, 312/286, 290, 239, 244, 257.1; 224/929, 930

(56) References Cited

U.S. PATENT DOCUMENTS

| | | | | |
|---|---|---|---|---|
| 941,608 A | * | 11/1909 | Benson ..................... | 312/283 X |
| 1,342,269 A | * | 6/1920 | Stewart ..................... | 312/287 X |
| 2,584,048 A | * | 1/1952 | Ramsey .................... | 312/290 X |
| 2,728,624 A | * | 12/1955 | Caruso ...................... | 312/290 X |
| 3,424,509 A | * | 1/1969 | Siklos ....................... | 312/283 X |
| 3,891,288 A | * | 6/1975 | Marquette .................. | 211/151 |
| 4,095,861 A | * | 6/1978 | Kachidurian ............... | 312/321 |
| 4,241,833 A | * | 12/1980 | Luebcke ................... | 312/283 X |
| 4,659,154 A | * | 4/1987 | Jenkins ...................... | 312/277 |
| 4,896,070 A | * | 1/1990 | Reid et al. .................. | 312/290 |

FOREIGN PATENT DOCUMENTS

| | | | | |
|---|---|---|---|---|
| DE | 69090 | * | 6/1915 | ................. 312/290 |
| GB | 407504 | * | 3/1934 | ................. 312/290 |
| GB | 2344810 | | 6/2000 | |

* cited by examiner

Primary Examiner—James O. Hansen
(74) Attorney, Agent, or Firm—Sidley Austin Brown & Wood, LLP

(57) ABSTRACT

The invention relates to a portable housing, constructed to accommodate an audio or light mixer, the housing having an accommodating frame for the mixer with a bottom, a front wall, a rear wall, two sidewalls and an upper side. The housing is constructed in such a manner, that the mixer, in operation, can remain connected with the accommodating frame.

7 Claims, 4 Drawing Sheets

PORTABLE HOUSING CONSTRUCTED FOR ACCOMODATING AN AUDIO OR LIGHT MIXER

FIELD OF INVENTION

The invention relates to a portable housing, constructed for accommodating an audio or light mixer, the housing having an accommodating frame for the mixer with a bottom, a front wall, a rear wall, two sidewalls and an upper side.

BACKGROUND INFORMATION AND PRIOR ART

For large public functions or events, mixers are frequently operated in a 19-inch rack, which can no longer be transported by one person. Such racks are equipped with rollers and, frequently with carrying handles. Nevertheless, the racks can only be transported by two persons and then only over short distances.

Furthermore, suitcases and/or bags, in which a mixer can be transported and/or stored are already known. However, before a public function or event, the mixer must be taken out of the housing or bag and set up on a table or another suitable device.

Such portable audio or light mixers are frequently transported in a hectic atmosphere at the event and, are then removed from thee housing. After the event, such mixers must be taken down once again and packed once more. The conventional housing protects the mixer during transport against impacts, dirt and other external effects and serves to keep the mixer protected and free from dust.

OBJECT OF THE INVENTION

It is an object of the present invention to provide an improved portable housing for a mixer that facilitates the setting up and taking down of the mixer at the site of any public function or event.

SUMMARY OF THE INVENTION

This objective is accomplished with a portable housing, constructed to accommodate an audio or light mixer, the housing having an accommodating frame for the mixer with a bottom, a front wall, a rear wall, two sidewalls and an upper side, the housing being constructed so that the mixer, while being operated, remains connected with the accommodating frame.

An advantage is that the mixer remains at least partially protected against impacts, dirt and other effects from the outside, especially in the hectic atmosphere, which is frequently encountered at a public function or event.

According to a particularly preferred aspect of the invention, the accommodating frame furthermore defines a slide-in opening for accommodating an audio or light effect device. Such effect devices (effect processors), usually with a 19-inch dimension, are frequently operated with a mixer. Known sound effect types are, for instance reverb, delay, chorus, flanger, auto-pan, tap-delay, etc. The effect equipment in a slide-inch space below the mixer is also fastened to accommodating frame so that, when the mixer and the effect device are held in the 19-inch dimension, a transportable mini-rack is defined by the accommodating frame.

Preferably, one or more connecting openings are further provided in the housing, especially in the accommodating frame, to connect the mixer and optionally, the effect device.

Preferably, the accommodating frame further comprises an operating opening for the mixer, for permitting the mixer to be operated and removed from the accommodating frame.

In a particularly preferable embodiment, a hinge mechanism for the mixer is disposed at the accommodating frame and permits the mixer to swivel out of the accommodating frame. Under certain circumstances, by swiveling of the mixer, the connection to electrical leads is facilitated even further. The mixer can also be brought into an inclined position in which it can be operated conveniently by the user.

In addition to the operating and connecting opening, further functional openings or functional areas can be provided, such as an operating area, over which at least some of the functions of the mixer can be controlled through the wall of the housing. For example, pushbutton switches or lifting switches can be operated from the outside through a transparent sheet. A further functional opening could be defined by a ventilation opening for the mixer, so that a fan can aspirate surrounding air for cooling purposes or eject heat to the surroundings. The fan opening for the incoming air could also be equipped with a dust filter, which is accommodated in the wall of the housing. Finally, a functional field, transparent to infrared, may be provided, which permits an infrared interface, disposed in the mixer, to be operated while the mixer is left in the housing.

In a further advantageous development, the operating and connecting openings can be closed off particularly by doors. It is recommended that all operating and connecting doors be closed for transporting or storing the mixer, in order to protect the mixer against dust or damage. Even during the operation, operating and connecting openings, which are not required, can be covered completely or partly.

In a further advantageous development, the covering devices comprise at least one of a covering door, a rear door and a front door. The doors are firmly connected over a hinge with the accommodating frame of the housing. In a preferred embodiment, the doors can be affixed in one piece with the accommodating frame, the hinge being formed by a flexible region of the material of the accommodating frame. Alternatively, a hinge with mutually rotatable mechanical components is formed, in which the covering door, rear door and front door can be constructed from different materials.

In a particularly preferred embodiment, the housing is formed with an accommodating frame of a rigid or stiff material, such as wood or plastic. At the same time, the mixer is taken up completely in this accommodating frame such that the mix er protrudes only insignificantly, if at all, from the accommodating frame. In the case of a rigid or stiff configuration of the accommodating frame, the mixer is protected safely against damage during transport or storage and, also while being operated.

In a further preferred embodiment, the housing or the accommodating frame are formed at least partly from a flexible textile or textile-like material. In this configuration, the housing can be constructed more easily and possibly more inexpensively. At the same time, the cooling problems can be solved more simply or do not play a role at all. Nevertheless, in order to be able to transport and handle the mixer well and, at the same time, to reduce the risk of damage, the housing may be provided with reinforcing elements and with flexible or shock-absorbing protectors. The reinforcing elements may be constructed, for example, in the form of panels from plastic or wood and preferably from plywood. Such reinforcing elements reinforce the housing without increasing the manufacturing costs or the weight of the housing as a whole significantly.

In a preferred embodiment, the reinforcing elements are enclosed and preferably sewn in between two layers of the textile or textile like material. In this embodiment, the reinforcing elements are not visible either from the outside or from the inside. Corners and edges of the reinforcing elements are covered by the textile or textile-like material.

In order to more reliably fix the mixer in the accommodating frame of the housing, fastening rails, to which the mixer can be fixed with detachable fastening means, are provided preferably on the inside at the narrow sides of the housing. The fastening rails are advisably adapted to a panel-shaped reinforcing element, each enclosed at the sidewalls, the panel-shaped reinforcing element extending essentially over the whole of the cross section. The permanent connection, such as the bolting of the mixer and housing is advisable, for stabilizing the whole of the arrangement of housing and mixer, while the mixer being operated remains in the housing. When the present invention relates to a housing adapted to an audio or light mixer, it is understood that space for accommodating an effect device can always be provided, for example, at the front side.

In a further preferred embodiment, the covering door, preferably the rear door, and the front door can be swiveled about an axis, which extends essentially orthogonally to the side wall of the housing. Preferably, the covering door is swiveled, towards the rear and, can function as a cover for the connecting cable.

In a different, alternative embodiment, preferably in the form of a rigid or stiff accommodating frame, the covering devices can be designed so that they may be detached from the accommodating frame of the housing, such that, at the site of the public function or event, the mixer can remain in the housing while it is being set up and connected and only the covering devices are removed for starting up the mixer.

BRIEF DESCRIPTION OF THE DRAWINGS

The invention is described in greater detail below, also with respect to further distinguishing features and advantages, by means of the description of examples and with reference to the attached drawings, in which.

DESCRIPTION OF THE PREFERRED EMBODIMENTS

Figure 1:
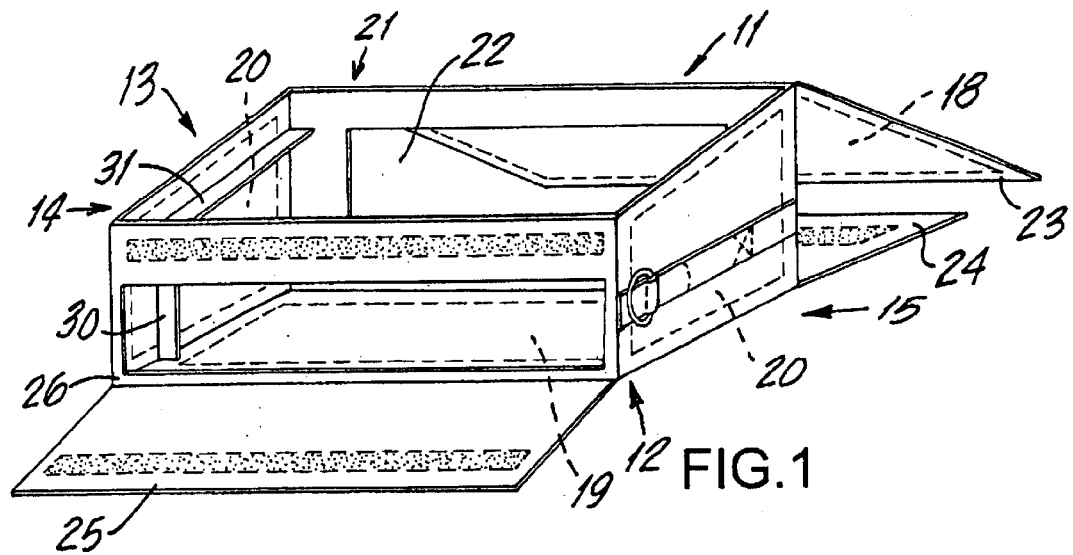
FIG. 1 shows a first embodiment of an inventive housing in a perspective view.

In FIG. 1, a first embodiment of the inventive housing is illustrated in a perspective view. The housing 13 comprises an accommodating frame 26 for the mixer with a bottom 12, a front wall 16, a rear wall 17, two sidewalls 14, 15 and an open upper side 11. At least during transport or storage, the mixer is essentially enclosed by the accommodating frame 26. In operation, the mixer remains connected at least with the accommodating frame 26. In the embodiment shown here, the accommodating frame 26 comprises a casing 51, formed from a resistant textile or textile-like material. The front wall 16 has a slide-in opening 43, which extends approximately over the whole width, and the rear wall 17 has a rectangular, elongated connecting opening 22. An operating opening 21 is defined by the open upper side 11, in order to operate a mixer, inserted in the accommodating frame, from above. Covering devices, namely a covering door 23, a rear door 24 and a front door 25 are disposed at the accommodating frame 26, which is constructed from a textile or textile-like material. In the present embodiment, the covering door 23, the rear door 24 and the front door 25 are formed from the same material as the accommodating frame 26. The accommodating frame 26 comprises one or more layers of the textile or textile-like material, the covering door 23, the rear door 24 and the front door 25 preferably hanging seamlessly together with the respective layer of the accommodating frame 26.

In order to reinforce the accommodating frame 26 and the covering door 23, and possibly, the rear door 24 and the front door 25, the panel-shaped reinforcing elements 18, 19, 20, 29 are incorporated between the layers 27, 28 of the textile or textile-like material and each extend essentially over the whole surface of the covering door 23, the bottom 12 and the sidewalls 14, 15.

Figure 8:
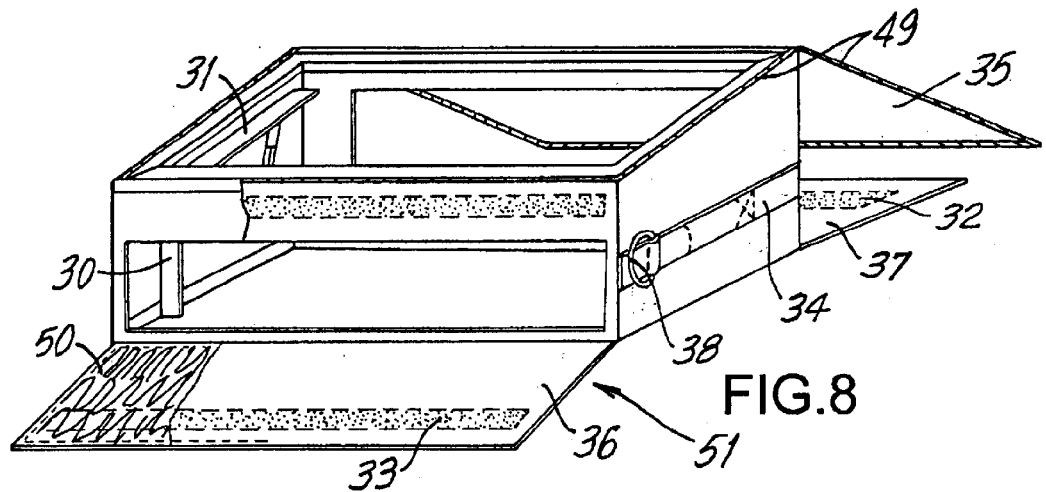
FIG. 8 shows the embodiment of the housing of FIG. 7 in a different perspective view and FIG. 9 shows a sectional view of the housing of FIG. 7.
Figure 9:
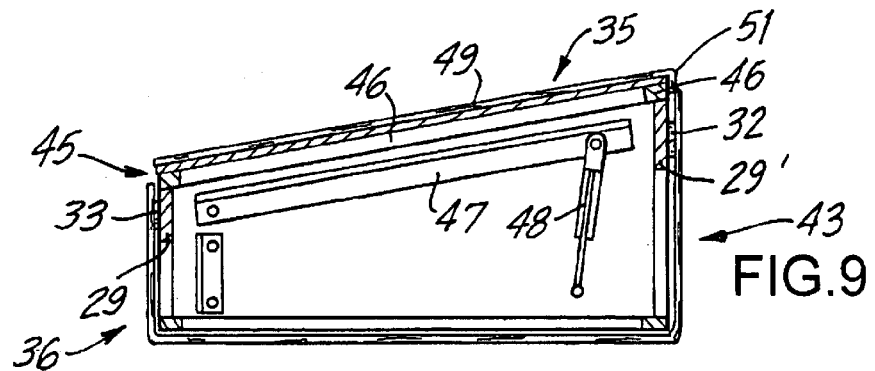

If the covering door 23 is open, a mixer, inserted in the accommodating frame 26, can remain in the housing while in operation. The necessary connections can be made over the connection opening 22 in the accommodating frame 26, the cable, taken to the mixer, additionally being covered and protected by the covering door 23, which has been swung out of the way towards the rear. In addition, there is room in the accommodating frame 26 to accommodate effect devices, which are pushed in from the front and, when the front door 25 is open, can then be operated over the slide-in opening 43 in the front wall 16. The front door 25 and the rear door 24 can be held in the closed position over Velcro fasteners 32, 33. The covering door 23 is also held in the closed position over Velcro fasteners 32, 33 or a different closing device, such as a belt and buckle or a zipper (see FIG. 7, 8, or 9).

On the outside of the sidewalls 14, 15, tapes 34 are disposed and preferably sewn, which have rings 38, 39 for suspension at a carrying belt.

Figure 3:
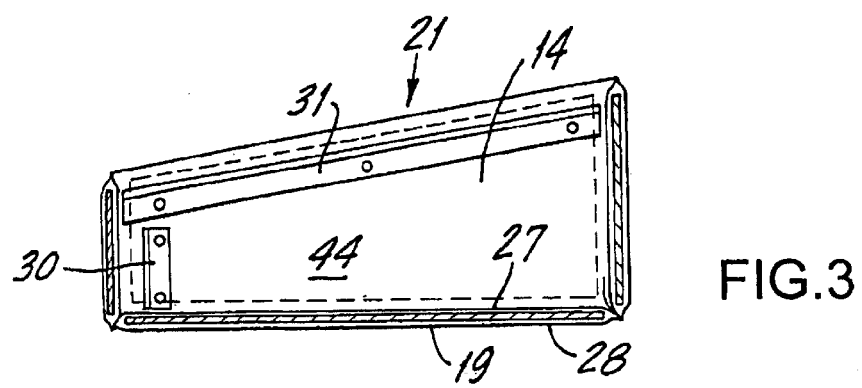
FIG. 3 shows a sectional view of the housing of FIG. 1.

On the inside of the sidewalls 14, 15, as can be seen even better in the sectional view of FIG. 3, fastening rails 50, 31 are attached, preferably by being riveted or bolted to the respective, enclosed, panel-shaped reinforcing element 20. The short fastening rail 30, which is aligned essentially vertically to the surface of the bottom 12, serves to connect an effect device at the front side. A fastening rail 31, which is inclined slightly with respect to the surface of the bottom 12, extends essentially over the whole width of the sidewall 14. Fastening rail 31 is used to fix the mixer in the housing 13. The mixer can preferably be bolted to, snapped on or fastened in some other way to the fastening rail 31. Both fastening rails 30, 31 of the mixer and of the effect device are at a distance from one another and constructed here in such a manner, that they are matched to the 19 inches dimension, which is generally customary.

Figure 2:
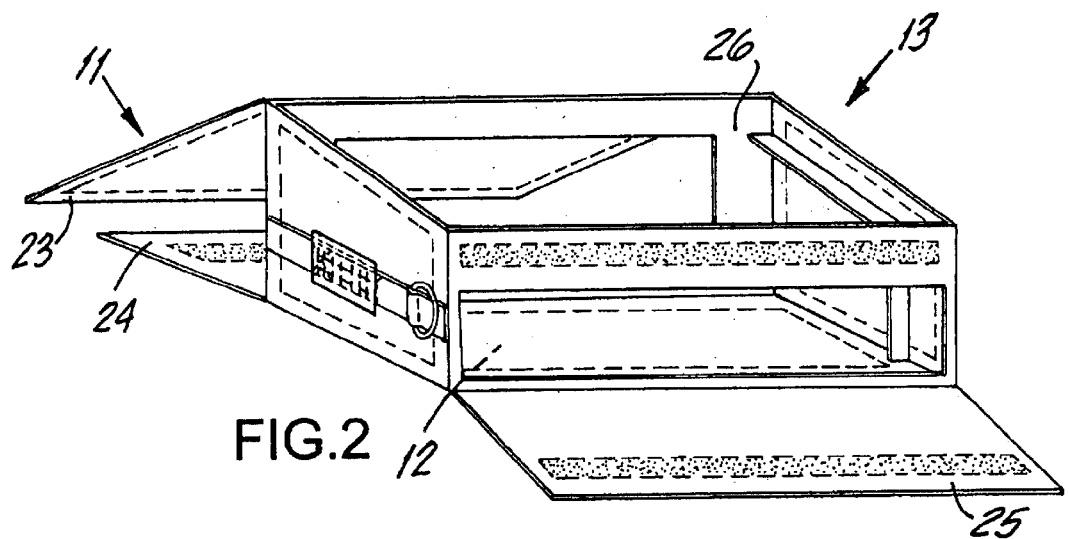
FIG. 2 shows the embodiment of the housing of FIG. 1 in a different perspective view.

In the case of the embodiment of FIGS. 1 to 3, the sidewall, when viewed from the outside to the inside, comprises a layer 27 of a textile or textile-like material, which lies against one side of the panel-shaped reinforcing element 20. The same or a similar layer of textile or textile like material is also disposed on the opposite side of the panel-shaped reinforcing element 20. The two layers around the reinforcing element 20 are connected with one another, so that the reinforcing element 20 is enclosed. Finally, at the inside of the sidewall 14, the fastening rail 31 is mounted, being connected by a riveted connection with the panel-shaped reinforcing element 20.

Figure 4:
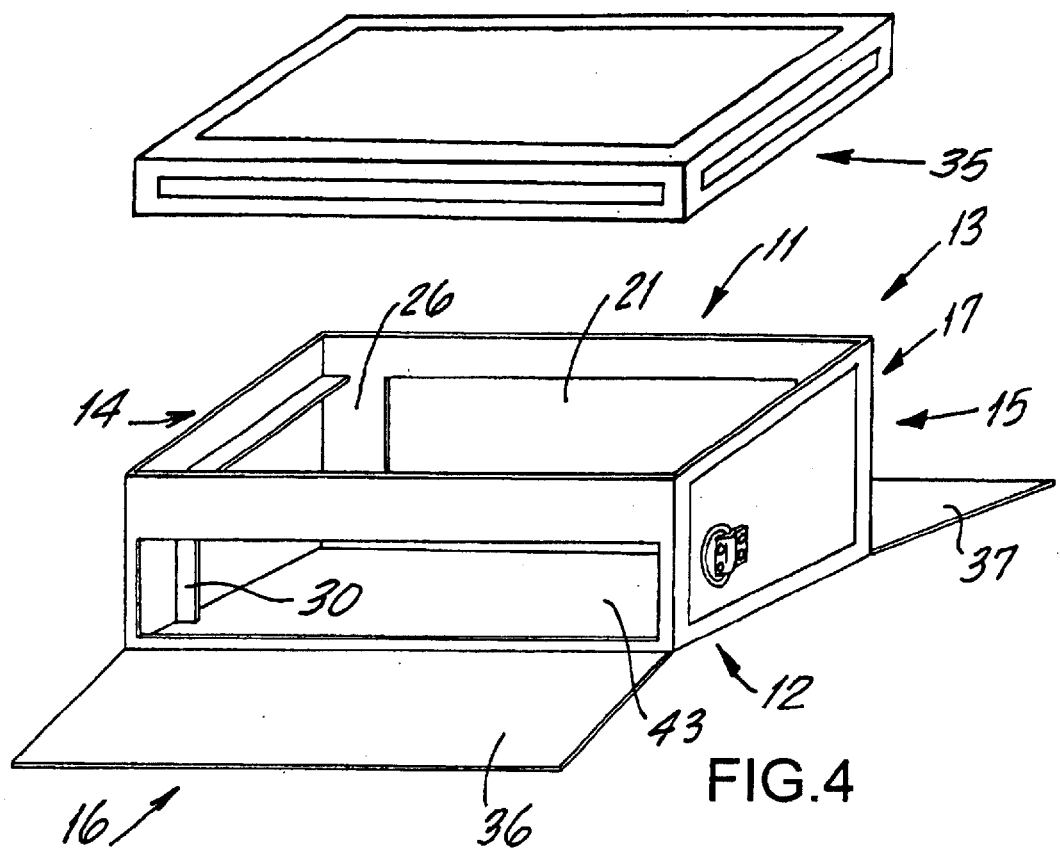
FIG. 4 shows an alternative embodiment of the inventive housing in an exploded view.

In FIG. 4, an alternative embodiment for a housing to accommodate a mixer is shown. The housing 13 of FIGS. 4, 5, 6a and 6b comprises an accommodating frame 26 of a rigid or stiff material, such as wood, plastic or metal. The accommodating frame 26 here also comprises a bottom 12, two side walls 14, 15, a front wall 16, and a rear wall 17. At the upper side 11 of the accommodating frame 26, opposite the bottom 12, an operating opening 21 is defined, which can be closed off with a lid 35. Once again, a slide-in opening 43 is provided in the front wall 16 for the operation of effect devices, which may be inserted in the accommodating frame 26. In the rear wall 17, a longitudinally extended connection opening 22 is provided, so the connections of the mixer and optionally of the effect device are accessible from the outside and so that the whole arrangement of mixer, effect device and housing 13 can easily be wired. For transport and storage, the operating opening 21 can be closed off with the lid 35, the connection opening 22 with a rear cover 37 and the slide-in opening 43 with a front cover 36, so that the mixer is enclosed on all sides and protected against damage and dust (see FIG. 6a, FIG. 6b).

Figure 5:
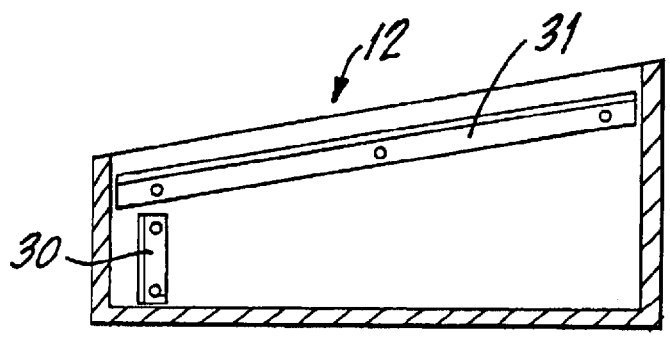
FIG. 5 shows a sectional view through the embodiment of FIG. 4.

In FIG. 5, a sectional view through the accommodating frame 26 of the housing 13 of FIG. 4 is shown, fastening rails 30, 31, as in FIG. 3, being fastened to the sidewall 14. The fastening rails 30, 31 fix an effect device, which can be operated from the front wall, as well as the mixer in the housing 13.

Figure 6A:
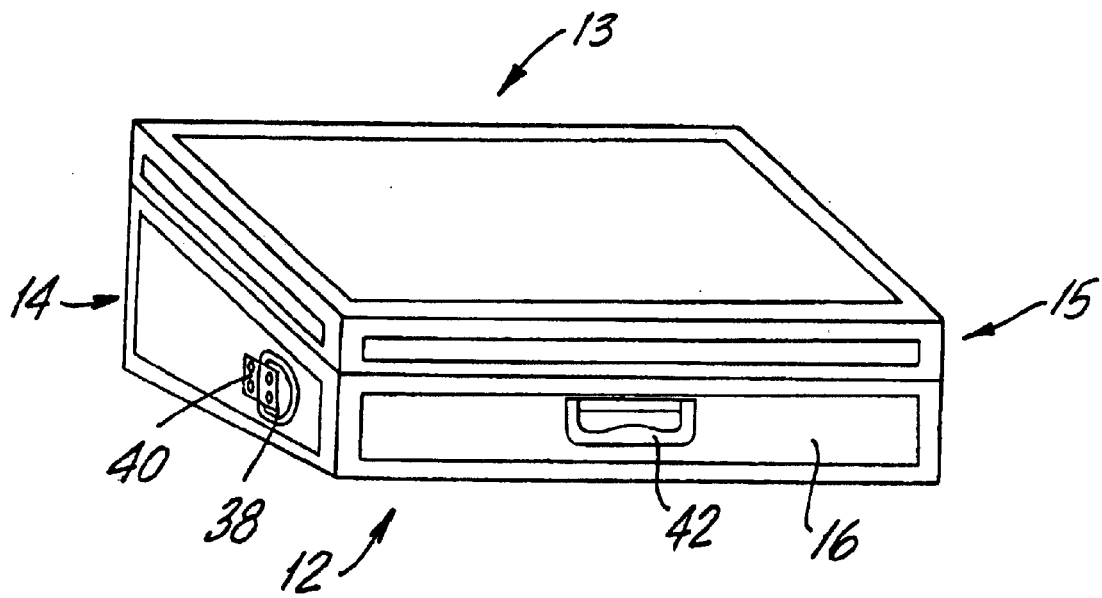
FIG. 6a shows the housing, represented in FIG. 4, in a closed form in a first perspective view.
Figure 6B:
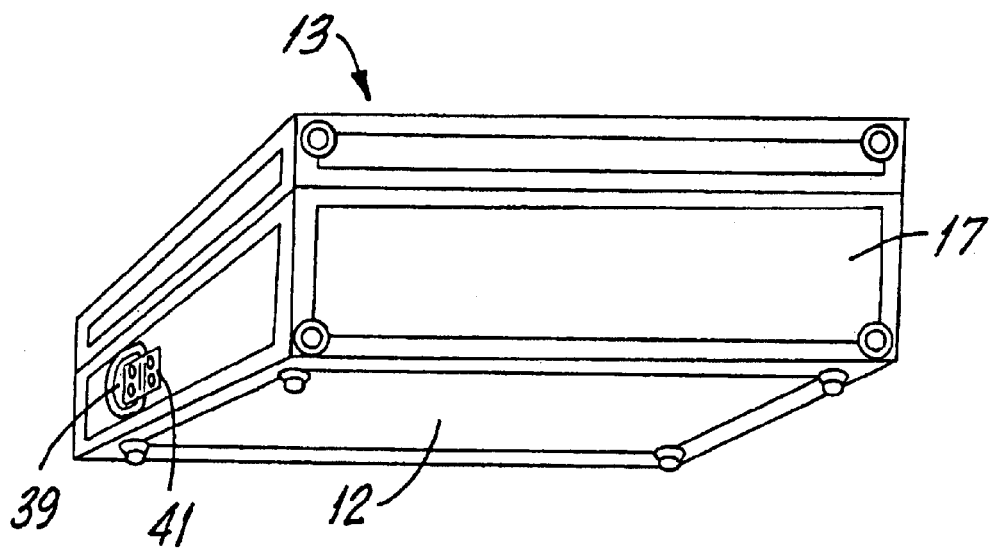
FIG. 6b shows the housing, represented in FIG. 4, in a closed form in a second perspective view.

In FIGS. 6a and 6b, the housing is shown in closed form. Rings 38, 39, are fixed with appropriate fastening plates 40, 41 in each case to the outside of the sidewall 14, 15 of the housing 13. A carrying belt (not shown) is attached to the rings 38, 39. Alternatively, the housing can be transported using a carrying handle 42.

The front cover 36, and the rear cover 37 can be fixed to the underside of the bottom 12 of the housing 13 with further Velcro fasteners.

Figure 7:
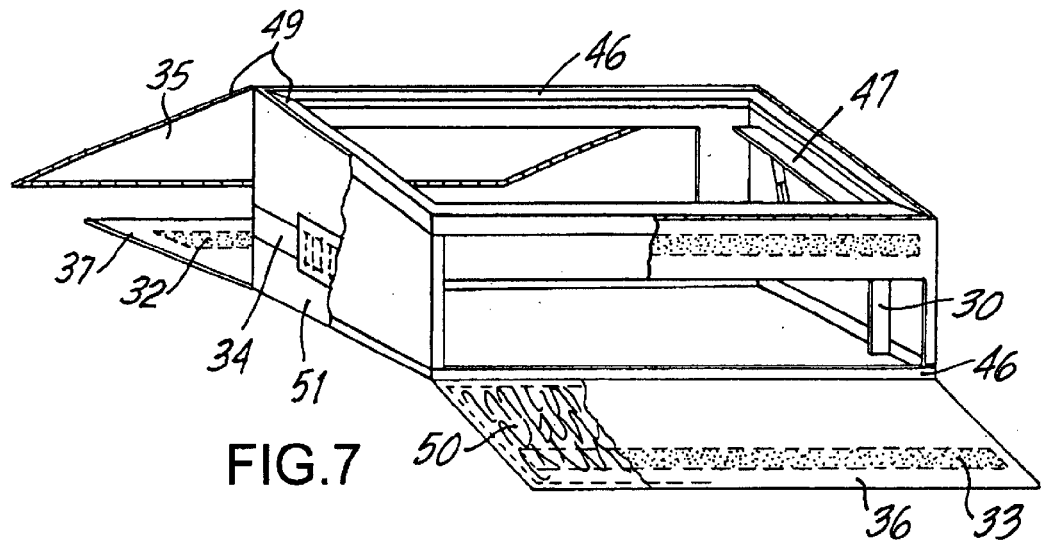
FIG. 7 shows a third alternative embodiment of the housing in a perspective view.

A third alternative embodiment for a housing to accommodate a mixer as well as an effect device is shown in FIG. 7. In the embodiment shown here, the accommodating frame 26 comprises a casing 51 from a resistant textile or textile-like material, such as a nylon fabric, a reinforcing frame 45, consisting of metal or plastic profiles 46, as well as of reinforcing elements 18, 19, 20, 29, which are disposed between the reinforcing frame 45 and are used here as plywood panels between the reinforcing frame 45 of metal or plastic profiles 46. The basic concept of bottom 12, sidewalls 14, 15, front wall 16, rear wall 17 and the operating openings 21 and 32 correspond to the configuration already explained in the embodiment of FIGS. 1 to 3. For closing of the operating opening 21 for the mixer, the edge of the covering door 23 is provided with one half of a zipper 29, the other half of which is correspondingly disposed along the upper edge of the accommodating frame 26 at the casing 51 of the housing.

In order to bring the mixer into a desired position, a swinging-out mechanism 47 interacts with the fastening rails 31 at the sidewalls 14, 15, such that the mixer can be swiveled out forwards and upwards out of the operating opening 21. In order to lock the swiveling mechanism 47 in a desired position, locking profiles 48 are provided, which arrest the fastening rail 31 in a desired angular position relative to the bottom 12.

The casing 51 is provided with interior upholstery 50 for shock insulation and absorption.

What is claimed as new and desired to be protected by letters patent is set forth in the appended claims.

What is claimed is:

1. A portable housing for receiving an audio or light mixer and an audio or light effect device, comprising a frame having a bottom, front and rear walls, two opposite side walls, and an upper side, the bottom, the front, rear, and side walls defining together a space within which the audio or light mixer and the audio or light effect device, respectively, are received, the frame further having first opening for operating the audio or light mixer receivable in the receiving space, and a second, slide-in opening spaced from the first operating opening and through which the audio or light effect device is inserted into the receiving space; and means provided within the frame for accommodating the audio or light mixer and the audio or light effect device in the receiving space.

2. A portable housing according to claim 1, wherein the first operating opening is formed in the upper side of the accommodating frame and is also used for introducing the audio or light mixer into the receiving space and for taking the audio or light mixer therefrom.

3. A portable housing according to claim 2, wherein the second, slide-in opening is formed in the front wall.

4. A portable housing according to claim 1, wherein the frame has a third opening for providing access to at least one audio or light mixer and the audio or light effect device.

5. A portable housing according to claim 4, wherein the third opening is formed in the rear wall.

6. A portable housing according to claim 5, further comprising cover means for closing at least one of the first, second and third openings.

7. A portable housing according to claim 1, wherein the accommodating means comprises rail means for securing the audio or light mixer and the audio or light effect device in the housing.

* * * * *